(12) United States Patent
Kubista

(10) Patent No.: US 6,813,751 B2
(45) Date of Patent: Nov. 2, 2004

(54) CREATING STANDARD VHDL TEST ENVIRONMENTS

(75) Inventor: Paul B. Kubista, West Concord, MN (US)

(73) Assignee: International Business Machines Corporation, Armonk, NY (US)

(*) Notice: Subject to any disclaimer, the term of this patent is extended or adjusted under 35 U.S.C. 154(b) by 106 days.

(21) Appl. No.: 10/196,670

(22) Filed: Jul. 16, 2002

(65) Prior Publication Data

US 2004/0015792 A1 Jan. 22, 2004

(51) Int. Cl.[7] .............................................. G06F 17/50
(52) U.S. Cl. .............................................. 716/4; 716/1
(58) Field of Search ........................................ 716/4, 1

(56) References Cited

U.S. PATENT DOCUMENTS

| | | | | |
|---|---|---|---|---|
| 3,599,098 A | * | 8/1971 | McPhail ..................... 324/765 |
| 5,095,441 A | * | 3/1992 | Hopper et al. ................ 716/18 |
| 5,146,593 A | * | 9/1992 | Brandle et al. ............. 709/328 |
| 5,150,308 A | * | 9/1992 | Hooper et al. ................ 716/18 |
| 5,175,696 A | * | 12/1992 | Hooper et al. ................ 716/18 |
| 5,452,226 A | * | 9/1995 | Hooper et al. ................ 716/18 |
| 5,732,247 A | * | 3/1998 | Dearth et al. ................. 703/13 |
| 6,363,520 B1 | * | 3/2002 | Boubezari et al. ............ 716/18 |
| 6,651,204 B1 | * | 11/2003 | Rajsuman et al. .......... 714/738 |

* cited by examiner

Primary Examiner—Vuthe Siek
Assistant Examiner—Sun James Lin
(74) Attorney, Agent, or Firm—Moser, Patterson & Sheridan, LLP

(57) ABSTRACT

A method, a data structure, a computer program product and a computer for testing digital designs defining integrated circuits in a HDL before actually building the integrated circuits and, more specifically, for creating standard test environments for digital designs. One embodiment provides a method of creating an entity description for use in an automated testing environment, the entity description defining an entity of an integrated circuit in a hardware description language, the entity of the integrated circuit comprising at least one interface having a plurality of ports each associated with a pre-determined function. The method comprises, for at least one port of the plurality of ports, associating at least one indication of a specific procedure call with the at least one port, the specific procedure call defining the pre-determined function of the at least one port.

36 Claims, 11 Drawing Sheets

```
ENTITY TEST IS
  PORT(
  ************************************************************
  -- Interface to a specific unit
  -- #SIM(Commands,TestProcedure_MX_TePr)
  ************************************************************
  TEST_BUFFER_AVAIL   : OUT  std_logic;
  -- #SIM(M10, avbl, 3, -, -, -, M1, -)
  TEST_REQUEST        : IN   std_logic;
  -- #SIM(M10, req, 4, -, -, L, -, -)
  TEST_MAP            : IN   std_logic_vector(3 downto 0);
  -- #SIM(M10, d3, 4, -, -, -, -, TePr)
  TEST_MSG            : IN   std_logic_vector(127 downto 0);
  -- #SIM(M10, d1, 4, len, -, -, M1, TePr)
  INT_DATA            : IN   std_logic_vector(127 downto 0);
  -- #SIM(M10, d2, 4, -, -, -, M1, TePr)
  ...
  );
  ...
End TEST;
```

Fig. 4

```
procedure TestProcedure(
    Model_Prefix  : in integer;
    Model_Control : in std_logic_vector((n_data_bits - 1) downto 0);
        611 ──► TESTMSG : IN std_logic_vector(127 downto 0);
        612 ──► INTDATA : IN std_logic_vector(127 downto 0);
    IS  613 ──► TESTMAP : IN std_logic_vector(3 downto 0)   )

variable write_data : std_logic_vector((n_data_bits - 1) downto 0)
    := (others => '0');
        variable len : integer := 0;
        variable signal_skip : std_logic := '0';
618 ──► variable pre_addr : std_logic_vector(7 downto 0):=(others => '0');
        :

begin
    len := Model_Prefix;
    signal_skip :=Model_Control (18);
        :

FOR i IN 1 to len loop
      if (i > L ) then
        :

else
632 ──► write_data(127 downto 0) :=   TESTMSG:
634 ──► write_array-function (..., write _data, ...);
        end if;
        :

if ((i = 1) and (signal_skip= '0')) then
642 ──► write_data(127 downto 0) := INTDATA;
644 ──► write_array_function(..., write_data,...);
        :

652 ──► write_data (127 downto 124):= TESTMAP;
654 ──► write_array_function(...,write_data , ...);
        end if ;
    end loop;
        :

end TestProcedure;
```

╱─900
    ┌─────────────────────────────────────────────────────────────────────┐
    │    library ieee;                                                    │
    │    library std;                                                     │
    │    library test;                                                    │
    │                                                                     │
    │    use ieee.std_logic_1164.all;                                     │
    │    use ieee.numreic_std.all;                                        │
    │    use std.textio.all;                                              │
    │    use common.other_procs.all;                                      │
    │                                                                     │
    │    ENTITY testbench_test_ent IS                                     │
    │    BEGING                                                           │
    │    END testbench_test_ent;                                          │
    │                                                                     │
    │    ARCHITECTURE testbench test_arc of testbench_test_ent is  ╱─920  │
    │ ┌─────────────────────────────────────────────────────────────┐     │
    │ │   :                                                         │     │
    │ │   :                                                         │     │
  932─┼──signal T_TEST_MAP         : std_logic_vector(3 downto 0); -- d3  │
  942─┼──signal T_TEST_MSG         ; std_logic_vector(127 downto 0); -- d1│
  952─┼──signal T_TEST_REQUEST     : std_logic;   -- req           │     │
    │ │ signal T_INT_DATA          : std_logic_vector(127 downto 0); -- d2│
  962─┼──signal T_TEST BUFFER_AVAIL : std_ogic;   -- avbl          │     │
  972─┼─ :                                                         │     │
    │ │                                                            │     │
    │ │  -- Global signals                                         │     │
    │ │     :                                                      │     │
    │ │     :                                                      │     │
    │ │                                                            │     │
    │ │  -- Model Definition                                       │     │
    │ │  -- Control Block Address Usage                            │     │
    │ │     CONSTANT READ_ADDR_START : std_logic_vector(31 downto 0):=X"80000001"; │
    │ │     CONSTANT M10 : integer  : inetr 1;                     │     │
    │ │     TYPE model_counts    is   ARRAY(1 to 111) of   interger ;│   │
    │ │                                                            │     │
    │ │  -- Master  Defines                                        │     │
    │ │     shared variable len    : model_counts : = (others = > 0)  ; │
    │ │     :                                                      │     │
    │ │     :                                                      │     │
    │ └─────────────────────────────────────────────────────────────┘     │
    │         BEGIN                                                       │
    │           :                                                         │
    │           :                                                         │
    └─────────────────────────────────────────────────────────────────────┘
```

*Fig. 9A*

```
--<><><><><><><><><><><><><><><><><><><><><><><><><><><><><><><>
-- Instantiate Test
--<><><><><><><><><><><><><><><><><><><><><><><><><><><><><><><>
    uut: ENTITY Test.Test(rt1)                              ┌─934
    ┌─────────────────────────────────────────────────────────┐
    │ PORT MAP (                                              │
    │   TEST_MAP          => T_TEST_MAP,                      │
    │   TEST_MSG          => T_TEST_MSG,                      │
    │   TEST_REQUEST      => T_TEST_REQUEST,                  │
    │   INT_DATA          => T_INT_DATA,                      │
    │   TEST_BUFFER_AVAIL => T_TEST_BUFFER_AVAIL,             │
    │     :                                                   │
    │     :                                                   │
    │   );                                                    │
    └─────────────────────────────────────────────────────────┘
```

```
--<><><><><><><><><><><><><><><><><><><><><><><><><><><><><><><>
-- M10 : Instantiate Model
--<><><><><><><><><><><><><><><><><><><><><><><><><><><><><><><>
    Model_M10 : PROCESS                                     ┌─944
    ┌─────────────────────────────────────────────────────────┐
    │       variable read_addr : std_logic_vector(31 downto 0) := │
    │   READ_ADDR_START;                                      │
    │945─► variable read_data ; std_logic_vector((n_data_bits - 1) downto 0) := │
    │       (others => '0');                                  │
    │946─► variable data1 ; std_logic_vector((n_data_bits - 1) downto 0) := │
    │       (others => '0');                                  │
    │947─► variable data2 : std_logic_vector((n_data_bits - 1) downto 0) := │
    │       (others => '0');                                  │
    │948─► variable data3 : std_logic_vector((n_data_bits - 1) downto 0) := │
    │       (others => '0');                                  │
    │       variable reset_signals : std_logic := '0';        │
    │918─► variable pre_addr : std_logic_vector(7 downto 0) :=X"01"; │
    │       :                                                 │
    │       :                                                 │
    └─────────────────────────────────────────────────────────┘
    ┌─────────────────────────────────────────────────────────┐ ┌─950
    │ BEGIN                                                   │
    │   if (reset_signals = '0') then                         │
    │       T_TEST_MSG     <= (others => 'Z');                │
    │       T_INT_DATA     <= (others => 'Z');                │
    │       T_TEST_MAP     <= (others => 'Z');                │
    │       T_TEST_REQUEST <= 'L';                            │
    │   end if;                                               │
    │                                                         │
    │   read_addr ;=READ_ADDR_START;                          │
    │   read_array_function(..., read_ addr,read_data, ...);  │
    │   len (M10) := tconv(read_data(63 downto 48)) + tconv(read_data(47 │
    │ downto 40)) + tconv (read_data (65 downto 64 )) ;       │
    │       :                                                 │
    │       :                                                 │
    └─────────────────────────────────────────────────────────┘
```

Fig. 9B

```
if (T_TEST_BUFFER_AVAIL /= '1') then
    wait until (T_TEST_BUFFER_AVAIL = '1');      ─962
end if;
     FOR i IN 1 to len(M10) loop
        if (i > 1) then
972 ──▶   read_array_function(...,read_addr, read_data, ...);
            if (i /=len(M10)) then
               read_addr:=read_addr  + 1;
            end if;
        end if;
974 ──▶ data1 := read_data;
976 ──▶ T_TEST_MSG <= data1(127 downto 0);
        if (i = 1) then
982 ──▶   read_array_function(...,read_addr, read_data, ...);
            read_addr :=read_addr + 1;
        else
984 ──▶   read_data  :=(others=> '0');
        end if;
986 ──▶ data2 := read_data;
988 ──▶ T_INT_DATA <= data2(127  downto  0);
        if (i = 1) then
992 ──▶   read_array_function(...,read_addr, read_data, ...);
            read_addr :=read_addr + 1;
        else
994 ──▶   read_data := (others => '0');
        end   if  ;
996 ──▶ data3 := read_data;
998 ──▶ T_TEST  MAP <= data3(127  downto  124);
        if (i = 1) then
            T_TEST REQUEST <=  '1';
        else                                      ─964
            T_TEST_REQUEST <=  '0';
        end    if  ;
              :
              :
     end loop;
              :
              :
END PROCESS Model_M10;
..................................................
              :
              :
END testbench_test_arc;
```

*Fig. 9C*

CREATING STANDARD VHDL TEST ENVIRONMENTS

BACKGROUND OF THE INVENTION

1. Field of the Invention

The present invention generally relates to testing of digital designs defining integrated circuits in a hardware description language and, more specifically, to creating standard test environments for digital designs.

2. Description of the Related Art

The proliferation of modern electronics into our everyday life is due in large part to the existence, functionality and relatively low cost of advanced integrated circuits. As technology moves ahead, the sophistication and, consequently, the complexity of design processes of integrated circuits continually increases.

An important aspect of designing a complex integrated circuit is the ability to thoroughly test the design of the integrated circuit to verify that the design complies with desired architectural, performance and design parameters. Verifying the logical correctness of a digital design and debugging the design, if necessary, are important steps in most digital design processes.

Integrated circuits are tested either by actually building networks or by simulating networks on a computer. Testing a complex integrated circuit requires the generation of a large number of instruction sequences to assure that the integrated circuit behaves properly under a wide variety of circumstances. Accordingly, testing has become a very costly and time-consuming segment of the overall design process as designs become increasingly complex. Since the fabrication of integrated circuits requires considerable-time and correction of mistakes is quite costly, it becomes necessary to test and simulate a design before the design is actually built.

Prior to testing, a designer creates a high-level description of an integrated circuit utilizing a hardware description language (HDL), such as VHDL or Verilog. VHDL is a higher-level language for describing the hardware design of complex integrated circuits. The overall circuit design is frequently divided into smaller parts, hereinafter referred to as design entities, which are individually designed, often by different designers.

FIG. 10 illustrates an exemplary design of an entity 1200 of an integrated circuit as described using a HDL according to the state of the art. Entity 1200 comprises a plurality of interfaces 1220, 1230, 1240, and 1250 and an architecture 1260. In VHDL, entity 1200 may further comprise one ore more configurations (not shown). Each Interface 1220, 1230, 1240 and 1250 comprises a plurality of input and output ports, each input port for receiving an input signal 1270 and each output port for providing an output signal 1280. A port may correspond to a pin on a corresponding integrated circuit or an edge connector on a board, and so on. The architecture 1260 describes the function of entity 1200. Accordingly, if the entity 1200 exemplarily represents a NAND-gate, architecture 1260 would describe how the output signal 1280 of the NAND-gate is created using appropriate input signals 1270. In a minimum configuration, entity 1200 may only comprise one interface having one input port and one output port.

Different entities of a digital design, for example, a plurality of entities 1200 according to FIG. 10, may be combined in a hierarchical manner to create an overall model. The hierarchical design technique is very useful in managing the enormous complexity of an overall design. Another advantage of this approach is that errors in a design entity are easier to detect when that entity is tested in isolation.

A problem arises, however, when the overall model is tested as a whole. Compound errors may occur which mask other individual errors. Further, the enormity of modern digital design complexity makes the errors in each design entity difficult to recognize. Therefore, although the hierarchical nature of VHDL eases the development and modeling phases of complex designs, problems with obtaining accurate and comprehensive test results of the overall design remain unresolved.

A useful method of addressing design complexity is to test digital designs at several levels of abstraction. At the functional level, system operation is described in terms of a sequence of transactions between registers, adders, memories and other functional units. Testing at the functional level is utilized to verify the high-level design of high-level systems. At the logical level, a digital system is described in terms of logic elements such as logic gates and flip-flops. Testing at the logic level is utilized to verify the correctness of the logic design. At the circuit level, each logic gate is described in terms of its circuit components such as transistors, impedances, capacitances, and other such devices. Testing at the circuit level provides detailed information about voltage levels and switching speeds.

For testing the design description, a designer may create a testbench. Such a testbench defines a test circuit and is constructed using the HDL. The testbench normally comprises the entity to be tested, i.e., a corresponding entity description, bus-functional models for driving the interfaces of the entity described by the entity description and an observer for observing the testing results. The bus-functional models and the observer are themselves separate modules. The testbench is used to apply stimulus to the design description and to verify whether the design operates as expected. The testbench is only used to verify input and output of the entity and is, accordingly, interface, i.e., hardware specific. Thus, the testbench has no architectural knowledge of the entity.

In current design processes, the testbench is manually generated by the designer and may then be instantiated by testcases for testing the corresponding entity description. However, manually creating testbenches for a large number of entity descriptions of a complex digital design is very time consuming and cumbersome for the designer. Furthermore, when migrating from one abstraction level to another in a digital design process, e.g., from the logical level to the circuit level, a testbench created at the logical level for testing a specific entity description may not be useable for testing the specific entity description at the circuit level as, for instance, corresponding interfaces of the entity description have been modified. Consequently, testbenches must either be modified or new testbenches must be created.

Therefore, there is a need to improve the creation of testing environments for digital designs in order to test and simulate a digital design more efficiently and effectively before the design is actually build.

SUMMARY OF THE INVENTION

The present invention generally is directed to a method, system and article of manufacture for testing of digital designs defining integrated circuits in a HDL and, more specifically, for creating standard test environments for digital designs. A digital design may comprise one or more entity descriptions describing different entities or blocks of the integrated circuit in the HDL. Tags are added to each entity description and used to generate procedure calls and a testbench for testing the corresponding entity.

One embodiment provides a method of creating an entity description for use in an automated testing environment, the entity description defining an entity of an integrated circuit in a hardware description language, the entity of the integrated circuit comprising at least one interface having a plurality of ports each associated with a pre-determined function. The method comprises, for at least one port of the plurality of ports, associating at least one specific procedure call with the at least one port, the specific procedure call defining the pre-determined function of the at least one port.

Another embodiment provides a method of generating a procedure call from an entity description, the entity description defining an entity of an integrated circuit in a hardware description language, the entity of the integrated circuit comprising at least one interface having a plurality of ports each associated with a pre-determined function. The method comprises: providing a plurality of build-in rules for constructing procedure calls; and providing a plurality of port description tags in the entity description, each port description tag associated with a specific port of the interface and comprising: at least one indication of a specific procedure call defining the pre-determined function of the associated specific port; and at least one parameter indicating a specific build-in rule for constructing the specific procedure call. The method further comprises, for at least one port description tag of the plurality of port description tags: determining the associated specific port, the at least one indication of a specific procedure call and the at least one parameter; determining the specific build-in rule from the plurality of build-in rules using the at least one determined parameter; and generating the specific procedure call using the at least one determined indication of the specific procedure call, the determined specific build-in rule and the determined associated specific port.

Still another embodiment provides a method of generating a testbench for testing an entity of an integrated circuit, the entity comprising at least one interface having a plurality of ports each associated with a pre-determined function, the entity being defined by an entity description in a hardware description language. The method comprises: providing a plurality of port description tags in the entity description, each port description tag associated with a port of the interface; providing a plurality of build-in rules for constructing procedure calls; generating at least one procedure call using at least one build-in rule of the plurality of build-in rules and at least one port description tag of the plurality of port description tags, the at least one procedure call defining the pre-determined function of the port associated with the at least one port description tag; and generating the testbench using the plurality of port description tags, at least one portion of the plurality of build-in rules and the at least one created procedure call.

Still another embodiment provides a computer-readable medium containing a program which, when executed, performs an operation of generating a procedure call from an entity description, the entity description defining an entity of an integrated circuit in a hardware description language, the entity of the integrated circuit comprising at least one interface having a plurality of ports each associated with a pre-determined function. The operation comprises: providing a plurality of build-in rules for constructing procedure calls; and accessing a plurality of port description tags in the entity description, each port description tag associated with a specific port of the interface and comprising: at least one indication of a specific procedure call defining the predetermined function of the associated specific port; and at least one parameter indicating a specific build-in rule for constructing the specific procedure call. The operation further comprises, for at least one port description tag of the plurality of port description tags: determining the associated specific port, the at least one indication of a specific procedure call and the at least one parameter; determining the specific build-in rule from the plurality of build-in rules using the at least one determined parameter; and generating the specific procedure call using the at least one determined indication of the specific procedure call, the determined specific build-in rule and the determined associated specific port.

Still another embodiment provides a computer-readable medium containing a program which, when executed, performs an operation of generating a testbench for testing an entity of an integrated circuit, the entity comprising at least one interface having a plurality of ports each associated with a pre-determined function, the entity being defined by an entity description in a hardware description language. The operation comprises: accessing a plurality of port description tags in the entity description, each port description tag associated with a port of the interface; providing a plurality of build-in rules for constructing procedure calls; generating at least one procedure call using at least one build-in rule of the plurality of build-in rules and at least one port description tag of the plurality of port description tags, the at least one procedure call defining the pre-determined function of the port associated with the at least one port description tag; and generating the testbench using the plurality of port description tags, at least one portion of the plurality of build-in rules and the at least one generated procedure call.

Still another embodiment provides a computer program product comprising a procedure call generator for generating a procedure call from an entity description, the entity description defining an entity of an integrated circuit in a hardware description language, the entity of the integrated circuit comprising at least one interface having a plurality of ports each associated with a pre-determined function; and a signal bearing medium containing the procedure call generator. The procedure call generator comprises: a plurality of build-in rules for constructing procedure calls; an accessing unit for accessing a plurality of port description tags in the entity description, each port description tag associated with a specific port of the interface and comprising at least one indication of a specific procedure call defining the pre-determined function of the associated specific port; and at least one parameter indicating a specific build-in rule for constructing the specific procedure call; a determining unit for determining, for at least one port description tag of the plurality of port description tags, the associated specific port, the at least one indication of a specific procedure call, the at least one parameter and the specific build-in rule from the plurality of build-in rules using the at least one determined parameter; and a generating unit for generating the specific procedure call using the at least one determined indication of the specific procedure call, the determined specific build-in rule and the determined associated specific port.

Still another embodiment provides a computer program product comprising a testbench generator for generating a testbench for testing an entity of an integrated circuit, the entity comprising at least one interface having a plurality of ports each associated with a pre-determined function, the entity being defined by an entity description in a hardware description language; and a signal bearing medium containing the testbench generator. The testbench generator comprises: a plurality of build-in rules for constructing procedure calls; an accessing unit for accessing a plurality of port description tags in the entity description, each port description tag associated with a port of the interface; a generating unit for generating at least one procedure call using at least one build-in rule of the plurality of build-in rules and at least one port description tag of the plurality of port description tags, the at least one procedure call defining the pre-determined function of the port associated with the at least one port description tag; and the testbench using the plurality of port description tags, at least one portion of the plurality of build-in rules and the at least one generated procedure call.

Still another embodiment provides a computer, comprising a memory and a processor adapted to execute contents of the memory. The memory contains at least a procedure call generator for generating at least one procedure call from an entity description, the entity description defining an entity of an integrated circuit in a hardware description language, the entity of the integrated circuit comprising at least one interface having a plurality of ports each associated with a pre-determined function; the at least one procedure call defining the pre-determined function of at least one port of the plurality of ports.

Still another embodiment provides a computer, comprising a memory and a processor adapted to execute contents of the memory. The memory contains at least a testbench generator for generating a testbench for testing an entity of an integrated circuit, the entity comprising at least one interface having a plurality of ports each associated with a pre-determined function, the entity being defined by an entity description in a hardware description language.

Still another embodiment provides a method of generating logic for an entity of an integrated circuit, the entity comprising at least one interface having a plurality of ports each associated with a pre-determined function, the entity being defined by an entity description in a hardware description language. The method comprises: providing a plurality of port description tags in the entity description, each port description tag associated with a port of the interface; providing a plurality of build-in rules for constructing logic; and generating logic using at least one build-in rule of the plurality of build-in rules and at least one port description tag of the plurality of port description tags, the logic defining an architecture of the entity and the pre-determined function of the port associated with the at least one port description tag.

Still another embodiment provides a computer-readable medium containing a program which, when executed, performs an operation of generating logic for an entity of an integrated circuit, the entity comprising at least one interface having a plurality of ports each associated with a pre-determined function, the entity being defined by an entity description in a hardware description language. The operation comprises: accessing a plurality of port description tags in the entity description, each port description tag associated with a port of the interface; providing a plurality of build-in rules for constructing logic; and generating logic using at least one build-in rule of the plurality of build-in rules and at least one port description tag of the plurality of port description tags, the logic defining an architecture of the entity and the pre-determined function of the port associated with the at least one port description tag.

Still another embodiment provides a computer, comprising a memory and a processor adapted to execute contents of the memory. The memory contains at least a logic generator for generating logic for an entity of an integrated circuit, the entity comprising at least one interface having a plurality of ports each associated with a pre-determined function, the entity being defined by an entity description in a hardware description language.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4 is an illustration of an entity description defining the exemplary entity of FIG. 3 using VHDL;

FIG. 6 is an illustration of an exemplary procedure call description;

FIGS. 9A to 9C are an illustration of a testbench description defining the testbench of FIG. 8 using VHDL.

DETAILED DESCRIPTION OF THE PREFERRED EMBODIMENTS

The present invention generally provides a method, a data structure, a computer program product and a computer for testing digital designs defining integrated circuits in a HDL and, more specifically, for creating standard test environments for digital designs.

One embodiment of the invention is implemented as a program product for use with a computer system such as, for example, the computing environment shown in FIG. 1 and described below. The program(s) of the program product defines functions of the embodiments (including the methods described herein) and can be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

Figure 1:
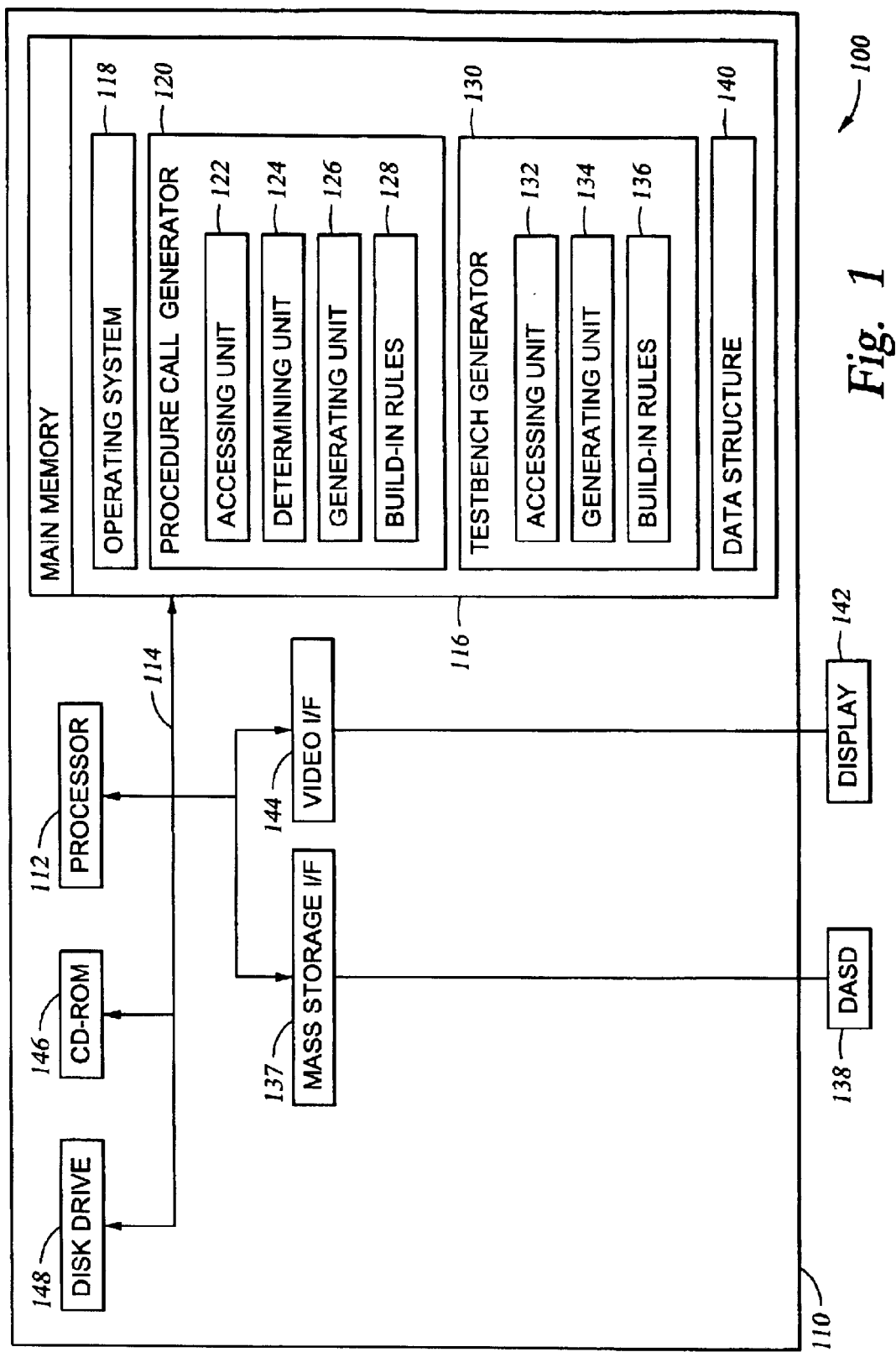
FIG. 1 is a high level diagram of a computing environment according to an embodiment of the invention.

Referring now to FIG. 1, a computing environment 100 comprising an illustrative computer system 110 according to one aspect of the present invention is shown. The computer system 110 may represent any type of computer, computer system or other programmable electronic device, including a client computer, a server computer, a portable computer, an embedded controller, a PC-based server, a minicomputer, a midrange computer, a mainframe computer, and other computers adapted to support the methods, data structure, computer program product and computer-readable mediums of the invention. Illustratively, the computer system 110 is a standalone device; however, in other embodiments, the computer system 110 is part of a networked system. In this regard, the invention may be practiced in a distributed computing environment in which tasks are performed by remote processing devices that are linked through a communications network. In a distributed computing environment, program modules may be located in both local and remote memory storage devices.

In any case, it is understood that FIG. 1 is merely one configuration for a computing environment and computer system. Embodiments of the invention can apply to any comparable configuration, regardless of whether the computer system 110 is a complicated multi-user apparatus, a single-user workstation, or a network appliance that does not have non-volatile storage of its own.

The computer system 110 could include a number of operators and peripheral systems as shown, for example, by a mass storage interface 137 operably connected to a direct access storage device 138, and by a video interface 144 operably connected to a display 142. The display 142 may be any video output device for outputting viewable information. The computer system 110 could further include a number of storage media drives such as a CD-ROM drive 146 and a diskette drive 148 suitable to read out information permanently stored on non-writable storage media (e.g., read-only memory devices within a computer such as CD-ROM disks readable by CD-ROM drive 146) or alterable information stored on writable storage media (e.g., floppy disks readable by diskette drive 148). CD-ROM drive 146 and diskette drive 148 are illustrated as forming an integral part of computer system 110. It should, however, be appreciated, that either CD-ROM drive 146 or diskette drive 148, or both of them, may be provided as peripheral devices that are operably connected to the computer system 110.

Computer system 110 may further comprise any type of suitable input means (not shown) to give input to the computer system 100. For example, a keyboard, keypad, light pen, touch screen, button, mouse, track ball, or speech recognition unit could be used. Further, this input means and display 142 could be combined. For example, a display screen with an integrated touch screen, a display with an integrated keyboard or a speech recognition unit combined with a text speech converter could be used.

Computer system 110 is shown comprising at least one processor 112, which obtains instructions, or operation codes, (also known as opcodes), and data via a bus 114 from a main memory 116. The processor 112 could be any processor adapted to support the methods of the invention. In particular, the computer processor 112 is selected to support the features of the present invention. Illustratively, the processor is a PowerPC processor available from International Business Machines Corporation of Armonk, N.Y.

The main-memory 116 is any memory sufficiently large to hold the necessary programs and data structures. Main memory 116 could be one or a combination of memory devices, including Random Access Memory, nonvolatile or backup memory, (e.g., programmable or Flash memories, read-only memories, etc.). In addition, memory 116 may be considered to include memory physically located elsewhere in computing environment 100, for example, any storage capacity used as virtual memory or stored on a mass storage device (e.g., direct access storage device 138) or on another computer coupled to the computer system 110.

As shown, the main memory 116 includes an operating system 118. The operating system 118 may be any suitable operating system capable of supporting the functions of the present invention. An exemplary operating system, which may be used to advantage, is Linux. The main memory 116 may additionally include a data structure 140 for storing any type of information, for example, entity descriptions in a HDL, procedure call files and testbench files.

The main memory 116 may further include a procedure call generator 120 for generating a procedure call from an entity description, the entity description defining an entity of an integrated circuit in a HDL, wherein the entity of the integrated circuit comprises at least one interface having one or more ports each associated with a pre-determined function. The procedure call generator 120 may comprise a plurality of build-in rules 128 for constructing procedure calls. The procedure call generator 120 may further comprise an accessing unit 122 for accessing one or more port description tags in the entity description, wherein each port description tag is associated with a specific port of the interface and comprises at least one indication of a specific procedure call defining the pre-determined function of the associated specific port and at least one parameter indicating a specific build-in rule for constructing the specific procedure call. The procedure call generator 120 may further comprise a determining unit 124 for determining, for at least one port description tag of the one or more port description tags, the associated specific port, the at least one indication of a specific procedure call, the at least one parameter and the specific build-in rule from the plurality of build-in rules using the at least one determined parameter. The procedure call generator 120 may further comprise a generating unit 126 for generating the specific procedure call using the at least one determined indication of the specific procedure call, the determined specific build-in rule and the determined associated specific port.

The main memory 116 may further include a testbench generator 130 for generating a testbench for testing an entity of an integrated circuit, wherein the entity comprises at least one interface having a plurality of ports each associated with a pre-determined function, the entity being defined by an entity description in a HDL. The testbench generator 130 may comprise a plurality of build-in rules 136 for constructing procedure calls. The testbench generator 130 may further comprise an accessing unit 132 for accessing a plurality of port description tags in the entity description, wherein each port description tag is associated with a port of the interface. The testbench generator 130 may further comprise a generating unit 134 for generating at least one procedure call using at least one build-in rule of the plurality of build-in rules and at least one port description tag of the plurality of port description tags, wherein the at least one procedure call defines the pre-determined function of the port associated with the at least one port description tag; and the testbench using the plurality of port description tags, at least one portion of the plurality of build-in rules and the at least one generated procedure call.

It should be appreciated that although the procedure call generator 120 and the testbench generator 130 have been illustrated separately from each other, they may, however, be implemented as a single generator. Alternatively, the procedure call generator 120 and the testbench generator 130 may share common elements, for example, common build-in rules, a common accessing unit and/or a common generating unit. Still alternatively, the procedure call generator 120 may represent an integral part of the testbench generator 130. Furthermore, it should be appreciated that embodiments of the invention can apply to any comparable configuration of computer system 110, regardless of whether the computer system 110 is a complicated multi-user apparatus, a single-user workstation, or a network appliance that does not have non-volatile storage of its own.

Figure 2:
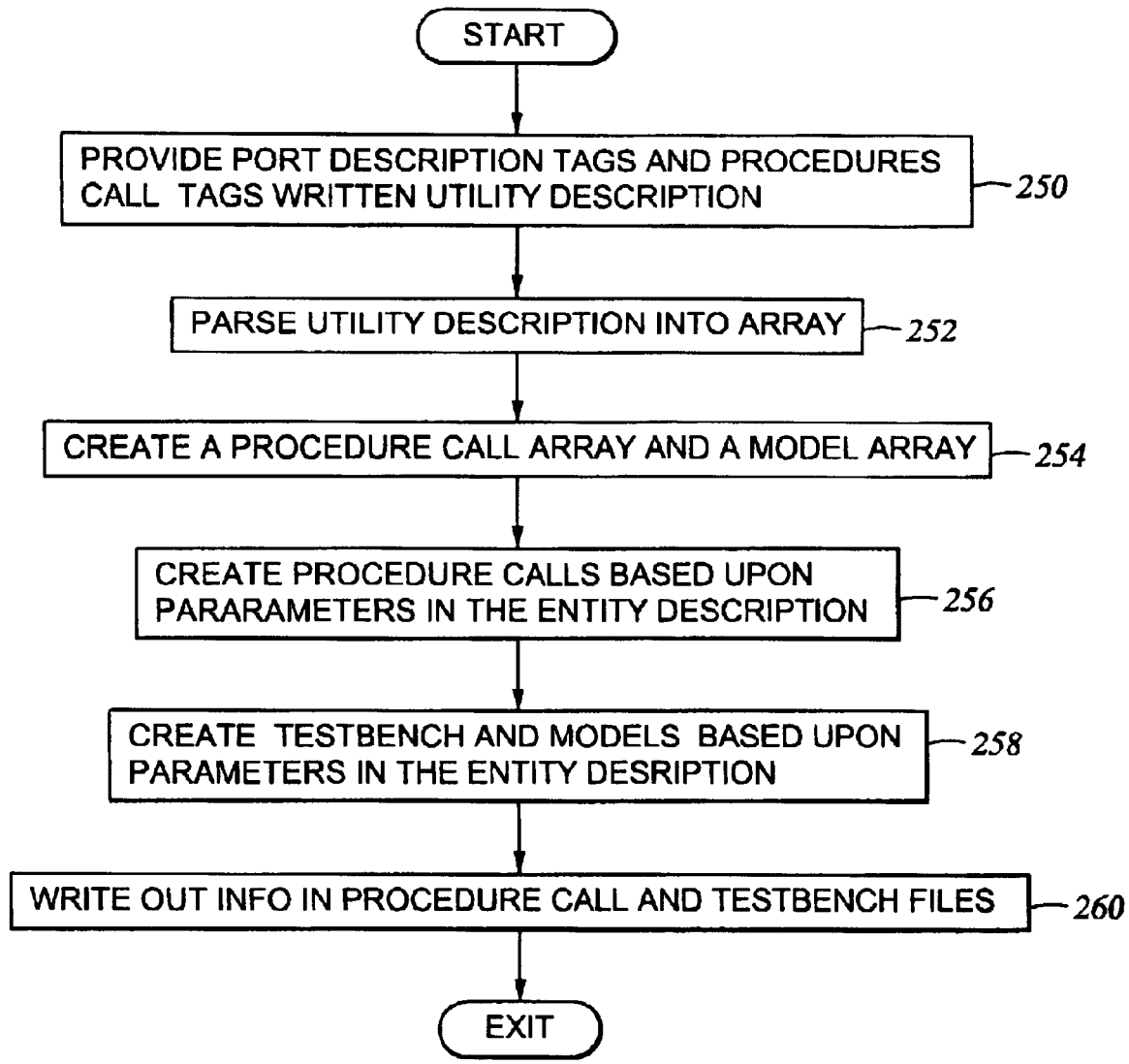
FIG. 2 is a flow chart illustrating generation of procedure calls and testbench files according to another embodiment of the invention.

FIG. 2 shows a flow chart illustrating generation of procedure calls and testbench files according to one embodiment of the invention. The procedure calls and testbench files may be used for testing an entity description in a testing environment. The entity description defines an entity of an integrated circuit in a HDL, the entity of the integrated circuit comprising at least one interface having a plurality of ports each associated with a pre-determined function.

In step 250, at least one port description tag is provided in the entity description. Each port description tag is associated with a specific port and comprises at least one indication of a specific procedure call associated with a port of an interface of the entity description. The specific procedure call defines the pre-determined function of the associated specific port. Each port description tag may further comprise one or more parameters, each parameter indicating a specific build-in rule from a plurality of build-in rules for constructing corresponding procedure calls.

Furthermore, at least one procedure call tag may be provided in the entity description. A procedure call tag is used to indicate at least one procedure call to be generated. The indication may comprise, for example, the name of the procedure call. Alternatively, instead of providing one or more procedure call tags within the entity description, the indication of the at least one procedure call to be generated may be provided within corresponding port description tags.

In step 252, the entity description is accessed and the relevant information for generating one or more procedure calls and a testbench for the entity description is extracted. For this end, the entity description may be parsed using a parser programmed in any available programming language, such as C, C++ or Java. The relevant information may be extracted to an array, which may be structured as a table, and stored in memory, e.g., main memory 116 of FIG. 1.

In step 254, the relevant information comprised in the array created in step S152 is retrieved to determine information required for generation of procedure calls and information required for generation of a testbench, the testbench comprising models for driving interfaces of the entity description. Using the information required for generation of procedure calls, a procedure call array including the information relating to the procedure calls may be created. Using the information required for generation of a testbench, a model array comprising the information related to the model generation may be created.

In step 256, procedure calls are created based upon the information in the procedure call array and parameters in the entity description. By using the parameters in the entity description, corresponding build-in rules may be determined for creating the procedure calls. The build-in rules define how to construct the procedure calls in general and how to include the corresponding ports into the procedure calls.

In step 258, a testbench comprising models for driving the interfaces are created based upon the parameters comprised in the entity description, information comprised in the model array and the created procedure calls. The testbench comprises a data array and a control array for providing stimuli to the entity specified by the entity description while testing. The data array and the control array are populated using the created procedure calls. The models and the testbench are created using corresponding build-in rules from the plurality of build-in rules.

In step 260, the created procedure calls are written into corresponding procedure call files. Furthermore, the created testbench comprising the created models is written into a corresponding testbench file.

Figure 10:
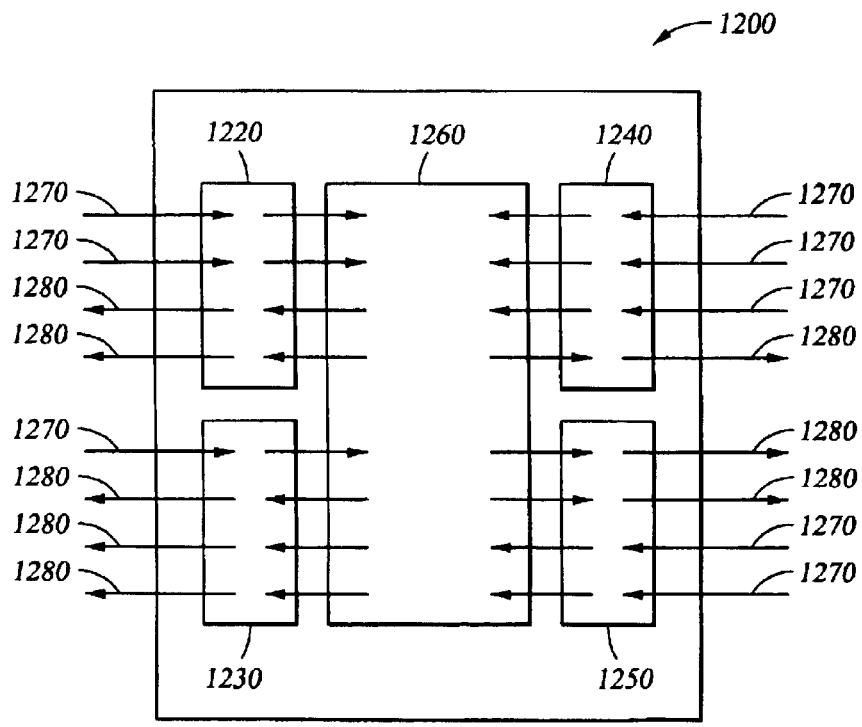
FIG. 10 is an illustrative block diagram of a digital design of an entity of an integrated circuit according to the state of the art.

With reference to FIGS. 3–9C, the creation of a standard testing environment for an entity description in VHDL of an entity of an integrated circuit (e.g., entity 1200 of FIG. 10) will be further explained by way of an illustrative example. Although reference is made to an entity description in VHDL, it should be noted that the present invention contemplates any known or unknown HDL.

Figure 3:
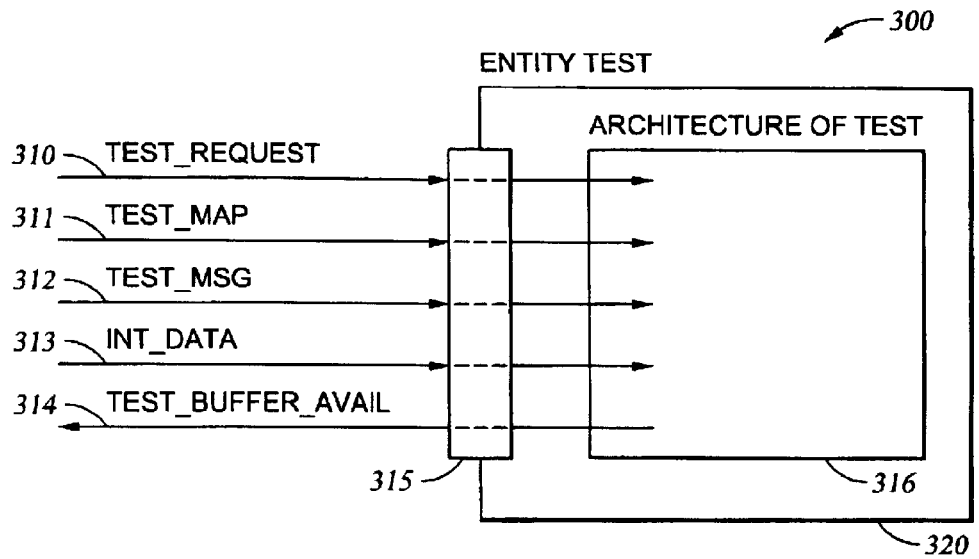
FIG. 3 is an illustrative block diagram of an exemplary VHDL entity.

FIG. 3 illustrates an exemplary entity 300 labeled "ENTITY TEST" of an integrated circuit. The exemplary entity 300 comprises a body 320 including one interface 315 (e.g., one of interfaces 1220, 1230, 1240 and 1250 of FIG. 10) and an architecture 316 (e.g., architecture 1260 of FIG. 10) labeled "ARCHITECTURE OF TEST". The interface 315 comprises five ports including four input ports for receiving input signals 310, 311, 312 and 314 (e.g., input signals 1270 of FIG. 10), and one output port for providing output signal 314 (e.g., output signal 1280 of FIG. 10). The first input port is used for receiving input signal 310 labeled "TEST_REQUEST", the second input port is used for receiving input signal 311 labeled "TEST_MAP", the third input port is used for receiving input signal 312 labeled "TEST_MSG", the fourth input port is used for receiving input signal 313 labeled "INT_DATA", and the output port is used for outputting output signal 314 labeled "TEST_BUFFER_AVAIL".

In the illustrated example, interface 315 is used to transmit signals 310, 311, 312, and 313 to the architecture 316 and to transmit signal 314 from the architecture 316 to the outer world. As the details of architecture 316 will be readily understood and appreciated by persons skilled in the art, a more detailed description is not necessary.

In the following, the creation of procedure calls and a testbench for testing exemplary entity 300 of FIG. 3 will be described in more detail with respect to FIGS. 4–9C. FIG. 4 illustrates an entity description 400 defining the exemplary entity 300 shown in FIG. 3 using VHDL, which may be stored in a corresponding VHDL file. Entity description 400 comprises a first portion 410 including a plurality of port declarations 432, 442, 452, 462, and 472 associated with interface 315 of FIG. 3. Port declaration 432 defines an output port of type "std_logic" for output signal 314. Port declaration 342 defines an input port of type "std_logic" for input signal 310. Port declaration 452 defines an input port of type "std_logic_vector" for input signal 311. Port declaration 462 defines an input port of type "std_logic_vector" for input signal 312. Port declaration 472 defines an input port of type "std_logic_vector" for input signal 313. Ports 432, 442, 452, 462 and 472 are labeled "TEST_BUFFER_AVAIL", "TEST_REQUEST", "TEST_MAP", "TEST_MSG" and "INT_DATA", respectively.

For each declared port 432, 442, 452, 462 and 472 an associated port description tag 434, 444, 454, 464 and 474, respectively, has been created. A port description tag may comprise a plurality of portions. Port description tags 434, 444, 454, 464 and 474 illustratively comprise a first portion "- - #SIM" used to indicate that the corresponding port description tag is to be used by a procedure call generator (e.g., procedure call generator 120 of FIG. 1) and/or a testbench generator (e.g., testbench generator 130 of FIG. 1) to include the associated port within a corresponding created procedure call and/or testbench. Port description tags 434, 444, 454, 464 and 474 illustratively comprise a second portion in parenthesis. The second portion may comprise a plurality of parameters indicating build-in rules required for constructing a corresponding procedure call and/or a testbench. Illustratively, the second portion comprises eight parameters, however, it should be appreciated that the number of parameters may be adapted to specific designer needs.

A first parameter may indicate what model the particular signal is associated with in the testbench. Corresponding code may be generated in the testbench based on the specified type of model. A second parameter may indicate the type or class of the associated signal. A third parameter may indicate a sequence number representing the time in the sequence that a corresponding signal can happen. A fourth parameter may indicate a repeat number that determines how many times to repeat driving a signal. For example, if data is to be streamed four consecutive data blocks, then "4" is included in this field for both the data and the data valid signals. A fifth parameter may indicate a drive delay that determines the number of cycles to delay before driving the signals. The default is to drive immediately. This drives the corresponding signal after the specified delay. A sixth parameter may indicate a reset value which is the value that the signal gets reset to. The default is "0". A seventh parameter may be a reserved parameter which could be attributed as required. The seventh parameter may, for example, be used to indicate a further model, which should comprise the same port associated with the port description tag as the model indicated in the first parameter. The eighth parameter may indicate a procedure call abbreviation designating a procedure call associated with the corresponding port.

In the illustrative example of FIG. 4, port description tag 434 "- - #SIM(M10, avbl, 3, -, -, -, M1, -)" is the port description tag associated with the output port labeled "TEST_BUFFER_AVAIL" declared in port declaration 432. Port description tag 444 "- - #SIM(M10, req, 4, -, -, L, -, -)" is the port description tag associated with the input port labeled "TEST_REQUEST" declared in port declaration 442. Port description tag 454 "- - #SIM(M10, d3, 4, -, -, -, -, TePr)" is the port description tag associated with the input port labeled "TEST_MAP" declared in port declaration 452. Port description tag 464 "- - #SIM(M10, d1, 4, len, -, -, M1, TePr)" is the port description tag associated with the input port labeled "TEST_MSG" declared in port declaration 462. Port description tag 474 "- - #SIM(M10, d2, 4, -, -, -, M1, TePr)" is the port description tag associated with the input port labeled "TEST_REQUEST" declared in port declaration 442.

For purposes of brevity, only the parameters in port description tag 454 "- - #SIM(M10, d3, 4, -, -, -, -, TePr)" will be described in more detail. The first parameter "M10" indicates that the associated signal "TEST_MAP" is associated with a model labeled "M10" in the testbench. The second parameter "d3" indicates that the associated signal "TEST_MAP" is associated with the third block of input data. The third parameter "4" indicates as sequence number the number "4" representing the time in the sequence that the associated signal "TEST_MAP" can happen. The eighth parameter indicates that a procedure call having as abbreviation "TePr" is associated with the associated signal "TEST_MAP".

The first portion 410 further comprises an illustrative procedure call tag 480. The procedure call tag may indicate the full name of at least one procedure call to be generated and a corresponding abbreviation. Alternatively, the port description tags may comprise full procedure call names instead of comprising only the corresponding abbreviation.

Procedure call tag 480 illustratively comprises a portion "TestProcedure_MX_TePr" that indicates the procedure call name "TestProcedure" representing the full procedure call name. "TePr" represents an abbreviation for the procedure call name, which is also specified in any port description tag, if the associated port has to be included in the procedure call, as e.g., in port description tags 454, 464 and 474. Procedure call tag 480 further comprises a portion "Commands" indicating that procedure call tag 480 should be read in by the generator to determine the full name and the abbreviation of the corresponding procedure call tag.

Entity description 400 may further comprise a second portion 420 including an architecture and/or one or more configurations. For purposes of brevity, no architecture and/or configuration has been included in the present example.

Figure 5:
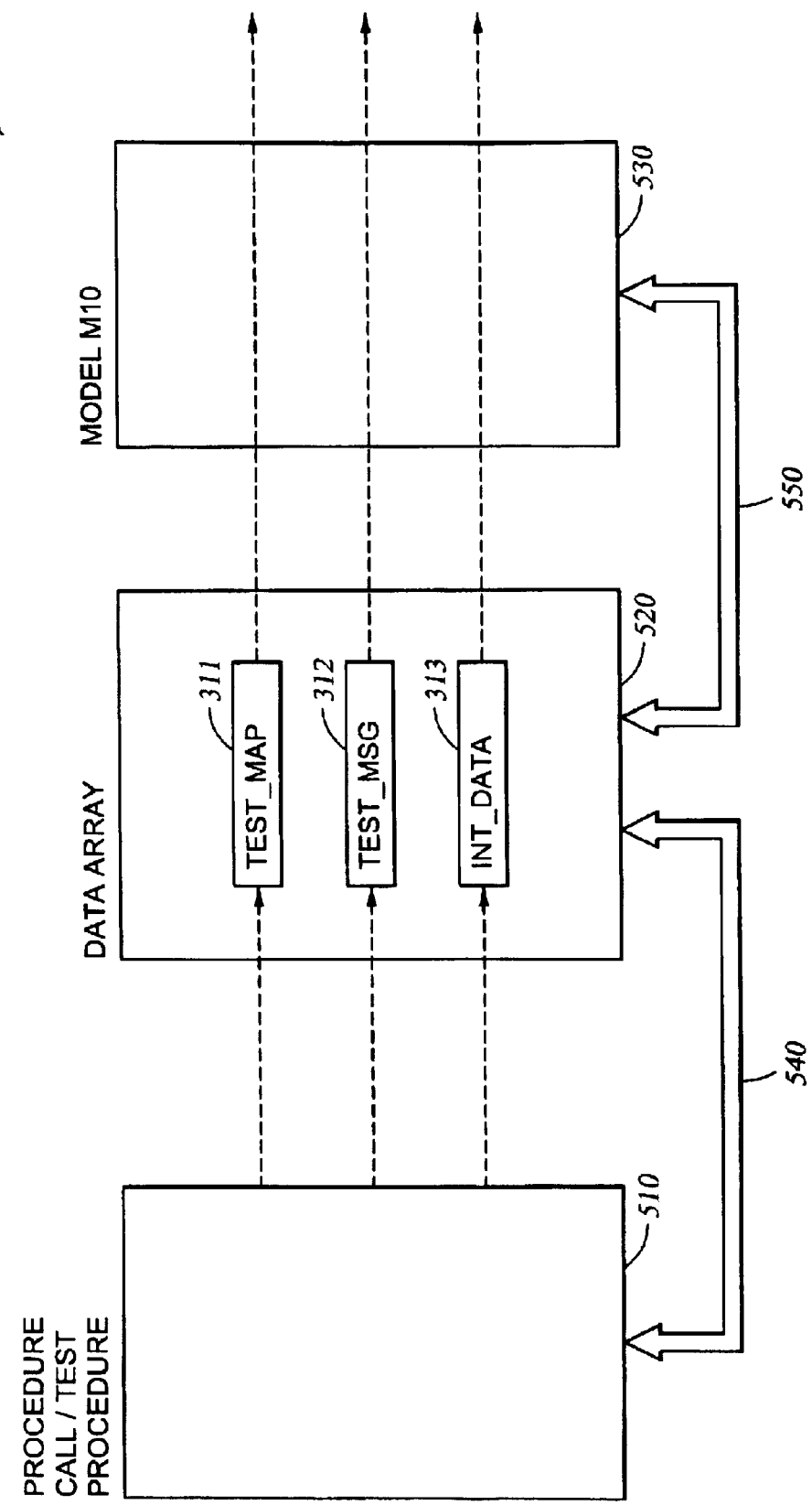
FIG. 5 is an illustrative block diagram of a portion of a generated standard testing environment.

FIG. 5 shows a portion 500 of a standard testing environment, which has been created using the port description tags 434, 444, 454, 464 and 474 of entity description 400 of FIG. 4 defining entity 300 of FIG. 3. Portion 500 comprises a procedure call 510, a data array 520 and a model 530. Procedure call 510 is labeled "TestProcedure" and model 530 is labeled "M10".

To create procedure call 510, a procedure call generator (e.g., procedure call generator 120 of FIG. 1) is used. Entity description 400 of FIG. 4 is accessed using an accessing unit (e.g., accessing unit 122 of FIG. 1) to retrieve port description tags 434, 444, 454, 464 and 474 in the entity description 400. Port description tags 452, 462 and 472 of FIG. 4, which are each associated with a specific port of the interface, indicate that a specific procedure call with the abbreviation "TePr" is to be created. Procedure call tag 480 indicates that the abbreviation "TePr" is associated with the full procedure call name "TestProcedure". Furthermore, each of the port description tags comprises at least one parameter indicating a specific build-in rule for constructing the specific procedure call.

A determining unit (e.g., determining unit 124 of FIG. 1) may be used to determine for each port description tag of the plurality of port description tags the associated specific port, the indication of a specific procedure call and the at least one parameter. Using the at least one determined parameter, the determining unit may determine the specific build-in rule from the plurality of build-in rules (e.g., build-in rules 128 of FIG. 1). Using a generating unit (e.g., generating unit 126 of FIG. 1), procedure call 510 labeled "TestProcedure" may be generated using the at least one determined indication of the specific procedure call, the determined specific build-in rules and the determined associated ports.

Procedure call 510 is isolated from how interface 315 of FIG. 3 actually works and is merely concerned with data flow issues. Accordingly, procedure call 510 is used for populating data array 520 for providing corresponding input signals for testing the corresponding entity description (e.g., entity description 300 of FIG. 3). To populate data array 520, procedure call 510 communicates with data array 520 as indicated by arrow 540.

If a procedure call tag (e.g., procedure call tag 480 of FIG. 4) is provided in the entity description, the accessing unit may be used to retrieve the full name and the abbreviation of the procedure call from the procedure call tag. The determining unit may then be used to determine the associated specific port and the at least one parameter indicating a corresponding build-in rule for each port description tag that comprises an indication of a specific procedure call matching that determined indication of the at least one procedure call to be generated. The determining unit may further be used to determine the specific build-in rules from the plurality of build-in rules using all determined parameters. Then, the generating unit will be used to generate the corresponding procedure call referred to by the full procedure call name using the determined specific build-in rules and the determined associated specific ports.

Populated data array 520 will communicate with model 530, as indicated by arrow 550, to provide stimuli to interface 315 when testing entity 300. Model 530 handles the execution of interface 315 and is also concerned with timing issues. In other words, model 530 is used to provide data of data array 520 to interface 315 testing with an appropriate timing.

FIG. 6 shows an exemplary procedure call description 600 illustrating procedure call 510 of FIG. 5 labeled "TestProcedure", which may be stored in a corresponding procedure call file in memory (e.g., within data structure 140 in memory 116 in FIG. 1). Procedure call description 600 includes a first portion 610 comprising signal and variable declarations and a second portion 620 representing a body of the procedure comprising statements to be executed.

The first portion 610 comprises signal declarations 611, 612 and 613 declaring signals "TESTMSG", "INTDATA" and "TESTMAP", respectively, for signals 312, 313 and 311 of FIG. 3, respectively, generated according to port description tags 464, 474 and 454 of FIG. 4, respectively. Furthermore, according to the build-in rules determined by the parameters defined in the port description tags, additional variables have been created in portion 610. These variables may also comprise variables, which are not necessary for execution of the procedure call and which are, accordingly, unused in the body portion 620 of the procedure call, as, for example, variable "pre_addr" declared in variable declaration 618.

Portion 620 essentially describes how procedure call 510 populates data array 520 of FIG. 5. Illustratively, in a statement 632 signal "TESTMSG" for signal 312 of FIG. 3 is attributed to a variable "write_data" declared in portion 610. In statement 634, a specific function is called to write the data attributed to the variable "write_data" to data array 520 at a specific write address. Illustratively, in a statement 642 signal "INTDATA" for signal 313 of FIG. 3 is attributed to the variable "write_data". In statement 644, the specific function is called to write the data attributed to the variable "write_data" to data array 520 at another write address. Illustratively, in a statement 652 signal "TESTMAP" for signal 311 of FIG. 3 is attributed to the variable "write_data". In statement 654, the specific function is called to write the data attributed to the variable "write_data" to data array 520 at still another write address.

Figure 7:
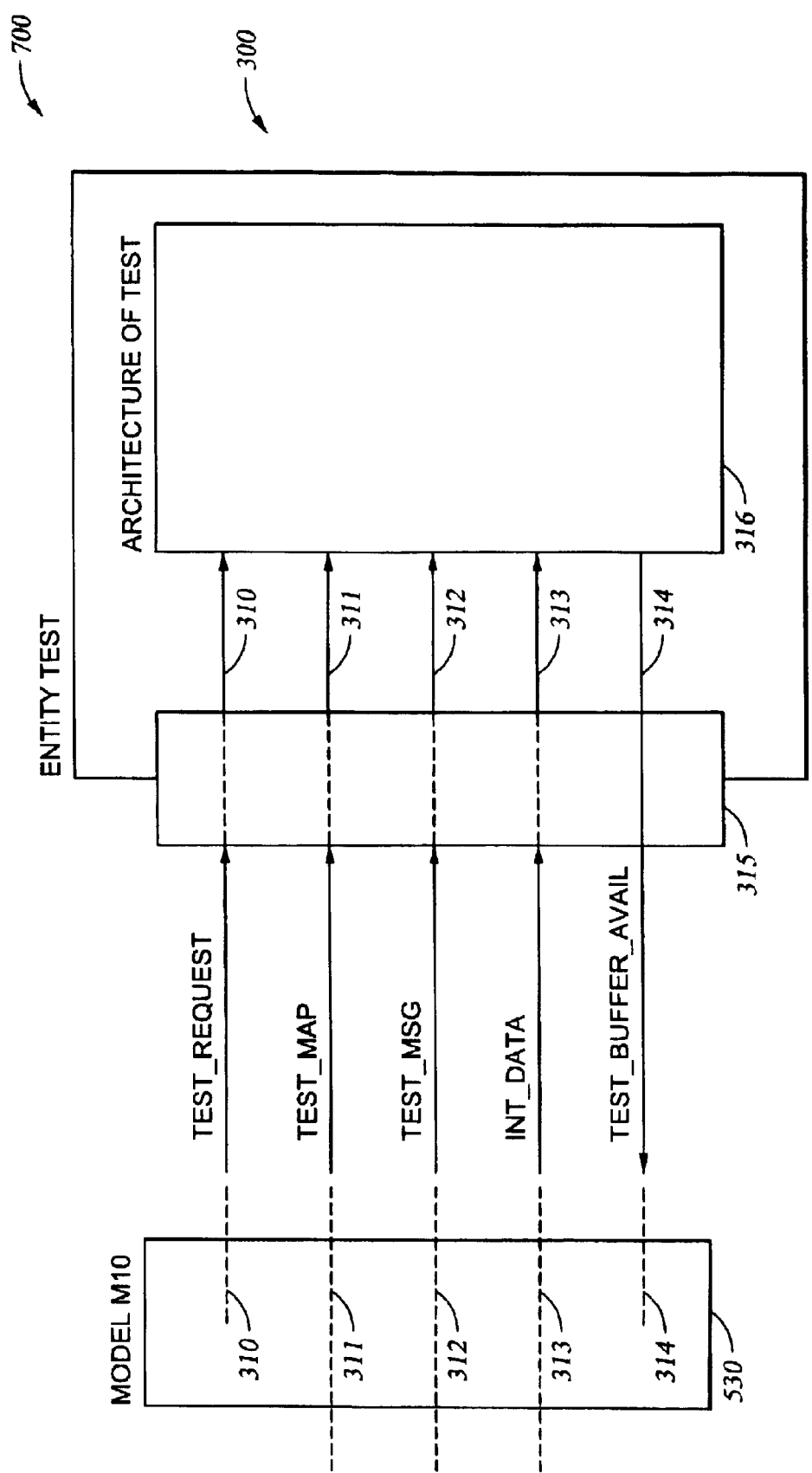
FIG. 7 is a block diagram of a portion of a testbench generated using a testbench generator.

FIG. 7 shows a portion 700 of a testbench created using a testbench generator (e.g. testbench generator 130 of FIG. 1) illustrating the function of model 530 of FIG. 5 in more detail. The portion 700 includes entity 300 of FIG. 3 comprising interface 315 and architecture 316, and model 530 of FIG. 5.

Model 530 is used to read out signals 311, 312 and 313 of a corresponding data array (e.g., data array 520 of FIG. 5), and to provide these signals to interface 315. Interface 315 will process these signals and provide them to architecture 316 of entity 300. Timing issues are considered within model 530 using signals 310 and 314 of FIG. 3 to provide signals 311, 312 and 313 with an appropriate timing to interface 315.

Figure 8:
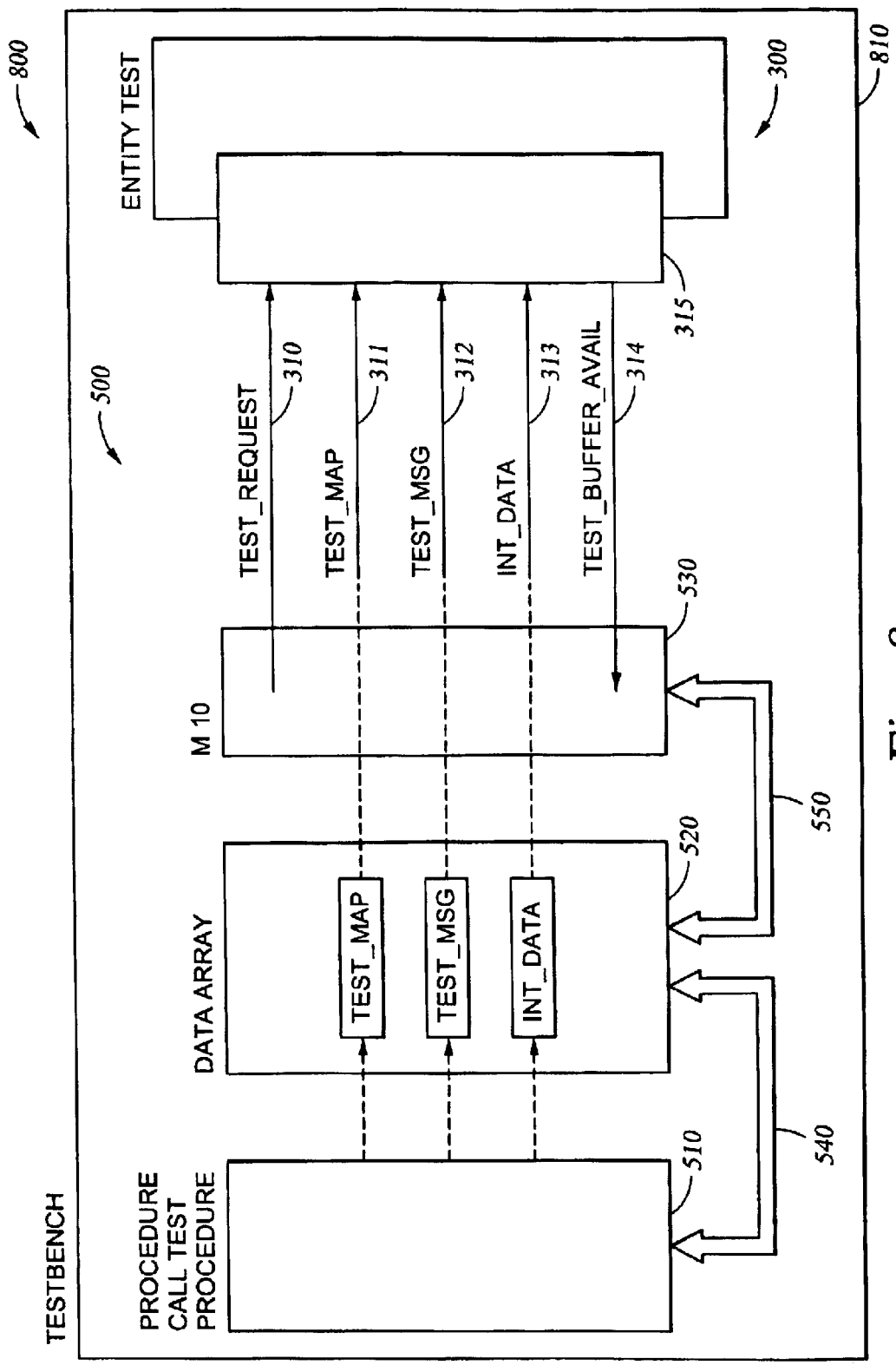
FIG. 8 is a block diagram of a testbench, which has been generated according to one embodiment of the invention.

FIG. 8 illustrates a testbench 800 labeled "TESTBENCH" which has been generated using a testbench generator according to one embodiment (e.g., testbench generator 130 of FIG. 1). Testbench 800 includes entity 300 of FIG. 3 with interface 315, and procedure call 510, data array 520 and model 530 of FIG. 5. Testbench 800 represents a standard testing unit combining components 510, 520, 530 and 300 as described with respect to the preceding FIGs. The testbench may be instantiated by a testcase having architectural knowledge of entity 300 to effectively test the entity.

FIGS. 9A to 9C show a testbench description 900 illustrating testbench 800 of FIG. 8 labeled "TESTBENCH", which may be stored in a corresponding testbench file in memory (e.g., within data structure 140 in memory 116 in FIG. 1). Testbench description 900 comprises different portions. A first portion 920 comprises signal and variable declarations for signals and variables used in the testbench description 900. Accordingly, signal declarations 932, 942, 952, 962 and 972 declare signals "T_TEST_MAP", "T_TEST_MSG", "T_TEST_REQUEST", "T_INT_DATA", and "T_TEST_BUFFER_AVAIL", respectively.

Referring now to FIG. 9B, testbench description 900 comprises a second portion 930, wherein the entity to be tested, i.e., entity 300 of FIG. 3, is instantiated. To this end, signals 932, 942, 952, 962 and 972 are mapped in a portion 934 to signals 311, 312, 310, 313 and 314 of entity 300 of FIG. 3, respectively.

A third portion 940 is used to instantiate model 530 of FIG. 5. The third portion 940 comprises a first part 944 including a plurality of variable declarations. For instance, in statements 945, 946, 947 and 948, variables "read_data", "data1", "data2" and "data3" are declared, and in a statement 918 a variable "pre_addr" corresponding to the variable created in statement 618 of FIG. 6 in the procedure call "TestProcedure" is declared. However, it should be appreciated that the variable "pre_addr" is not used in testbench description 900 and has only been created according to one or more specific build-in rules used for constructing the testbench on the basis of port description tags 434, 444, 454, 464 and 474 and procedure call tag 480 in FIG. 4.

Portion 940 further comprises a second part 950 representing a body of model 530. Referring now to FIG. 9C, testbench description 900 of testbench 800, and more specifically part 950, comprises a set of statements 962, wherein the testbench is prompted to delay operation until the interface 315 is available for testing.

Statement 972 indicates that a specific function is called to read out data from data array 520. The data "read_data" read from data array 520 is attributed to the variable "data1" in statement 974. In statement 976, "data1" is mapped to signal "T_TEST_MSG", which is mapped to signal "TEST_MSG" of the entity to be tested and, thereby, applied to the corresponding input port of entity 300.

Statement 982 indicates that the specific function is called to read out data from data array 520. The data "read_data" read from data array 520 is attributed to the variable "data2" in statement 986. In statement 988, "data2" is mapped to signal "T_INT_DATA", which is mapped to signal "INT_DATA" of the entity to be tested and, thereby, applied to the corresponding input port of entity 300. It should be noted, that the variable "read_data" need not be read from data array 520 at each time, but may also be attributed to any other values, as indicated in statement 984.

Statement 992 indicates that the specific function is called to read out data from data array 520. The data "read_data" read from data array 520 is attributed to the variable "data3" in statement 996. In statement 998, "data3" is mapped to signal "T_TEST_MAP", which is mapped to signal "TEST_MAP" of the entity to be tested and, thereby, applied to the corresponding input port of entity 300. It should be noted, that the variable "read_data" need not be read from data array 520 at each time, but may also be attributed to any other values, as indicated in statement 994.

Model 950 additionally comprises a set of statements 964 used to indicate, e.g., whether the operation is to be repeated or not.

While the foregoing is directed to embodiments of the present invention, other and further embodiments of the invention may be devised without departing from the basic scope thereof, and the scope thereof is determined by the claims that follow.

What is claimed is:

1. A method of creating an entity description for use in a testing environment, the entity description defining an entity of an integrated circuit in a hardware description language, the entity of the integrated circuit comprising at least one interface having a plurality of ports each associated with a pre-determined function, the method comprising, for at least one port of the plurality of ports:

associating at least one indication of at least one specific procedure call with the at least one port the specific procedure call defining the predetermined function of the at least one port and providing a port description tag associated with the at least one port, the port description tag comprising the at least one indication.

2. The method of claim 1, further comprising:

associating at least one parameter indicating a specific build-in rule of a plurality of build-in rules for constructing the specific procedure call with the at least one port.

3. The method of claim 1, further comprising:

providing the port description tag in the entity description.

4. A method of creating an entity description for use in a testing environment, the entity description defining an entity of an integrated circuit in a hardware description language, the entity of the integrated circuit comprising at least one interface having a plurality of ports each associated with a pre-determined function, the method comprising for at least one port of the plurality of ports:

associating at least one specific procedure call with the at least one port, the specific procedure call defining the predetermined function of the at least one port; associating at least one parameter indicating a specific build-in rule of a plurality of build-in rules for constructing the specific procedure call with the at least one port; and providing a port description tag associated with the at least one port, the port description tag comprising the at least one parameter.

5. The method of claim 4, wherein associating the at least one parameter with the at least one port comprises:

associating at least one indication of the at least one specific procedure call with the at least one port; and the port description tag further comprise the at least one indication.

6. A method of generating a procedure call from an entity description, the entity description defining an entity of an integrated circuit in a hardware description language, the entity of the integrated circuit comprising at least one interface having a plurality of ports each associated with a pre-determined function, the method comprising:

providing a plurality of build-in rules for constructing procedure calls;

providing a plurality of port description tags in the entity description, each port description tag associated with a specific port of the interface and comprising:

at least one indication of a specific procedure call defining the pre- determined function of the associated specific port; and at least one parameter indicating a specific build-in rule for constructing the specific procedure call; and for at least one port description tag of the plurality of port description tags:

determining the associated specific port, the at least one indication of a specific procedure call and the at least one parameter;

determining the specific build-in rule from the plurality of build-in rules using the at least one determined parameter; and generating the specific procedure call using the at least one determined indication of the specific procedure call, the determined specific build-in rule and the determined associated specific port.

7. The method of claim 6, further comprising:

providing a procedure call tag in the entity description, the procedure call tag comprising an indication of at least one procedure call to be generated.

8. The method of claim 7, further comprising:

determining the indication of the at least one procedure call to be generated from the procedure call tag;

for each port description tag comprising an indication of a specific procedure call that matches the determined indication of the at least one procedure call to be generated, determining the associated specific port and the at least one parameter;

determining the specific build-in rules from the plurality of build-in rules using the determined parameters; and generating the procedure call to be generated using the determined specific build-in rules and the determined associated specific ports.

9. A method of generating a testbench for testing an entity of an integrated circuit, the entity comprising at least one interface having a plurality of ports each associated with a pre-determined function, the entity being defined by an entity description in a hardware description language, the method comprising:

providing a plurality of port description tags in the entity description, each port description tag associated with a port of the interface;

providing a plurality of build-in rules for constructing procedure calls;

generating at least one procedure call using at least one build-In rule of the plurality of build-in rules and at least one port description tag of the plurality of port description tags, the at least one procedure call defining the pre-determined function of the port associated with the at least one port description tag; and generating the testbench using the plurality of port description tags, at least one portion of the plurality of build-In rules and the at least one created procedure call.

10. The method of claim 9, wherein generating the testbench comprises:

generating a model for driving the at least one interface using the ports associated with the plurality of port description tags and the at least one portion of the plurality of build-in rules.

11. The method of claim 9, wherein generating the testbench comprises:

generating a data array using the at least one procedure call, the data array comprising data to be processed by the at least one interface.

12. The method of claim 9, wherein generating the testbench comprises:

generating a control array using the at least one procedure call, the control array comprising data for controlling the at least one interface.

13. The method of claim 9, wherein generating the testbench comprises:

generating a data array using the at least one procedure call, the data array comprising data to be processed by the at least one interface;

generating a control array using the at least one procedure call, the control array comprising data for controlling the at least one interface; and generating a model for driving the at least one interface, the model using the data of the data array and the data of the control array the at least one interface.

14. The method of claim 13, wherein generating a model comprises:

generating the model using the ports associated with the plurality of port description tags and the at least one portion of the plurality of build-in rules.

15. A computer-readable medium containing a program which, when executed, performs an operation of generating a procedure call from an entity description, the entity description defining an entity of an integrated circuit in a hardware description language, the entity of the integrated circuit comprising at least one interface having a plurality of ports each associated with a pre-determined function, the operation comprising:

providing a plurality of build-in rules for constructing procedure calls;

accessing a plurality of port description tags in the entity description, each port description tag associated with a specific port of the interface and comprising:

at least one indication of a specific procedure call defining the pre-determined function of the associated specific port; and at least one parameter indicating a specific build-in rule for constructing the specific procedure call;

for at least one port description tag of the plurality of port description tags:

determining the associated specific port, the at least one indication of a specific procedure call and the at least one parameter;

determining the specific build-in rule from the plurality of build-in rules using the at least one determined parameter; and generating the specific procedure call using the at least one determined indication of the specific procedure call, the determined specific build-in rule and the determined associated specific port.

16. The computer-readable medium of claim 15, wherein the operation further comprises:

accessing a procedure call tag in the entity description, the procedure call tag comprising an indication of at least one procedure call to be generated.

17. The computer-readable medium of claim 16, wherein the operation further comprises:

determining the indication of the at least one procedure call to be generated from the procedure call tag;

for each port description tag comprising an indication of a specific procedure call that matches the determined indication of the at least one procedure call to be generated, determining the associated specific port and the at least one parameter;

determining the specific build-In rules from the plurality of build-in rules using the determined parameters; and generating the procedure call to be generated using the determined specific build-in rules and the determined associated specific ports.

18. A computer-readable medium containing a program which, when executed, performs an operation of generating a testbench for testing an entity of an integrated circuit, the entity comprising at least one interface having a plurality of ports each associated with a pre-determined function, the entity being defined by an entity description in a hardware description language, the operation comprising:

accessing a plurality of port description tags in the entity description, each port description tag associated with a port of the interface;

providing a plurality of build-in rules for constructing procedure calls;

generating at least one procedure call using at least one build-in rule of the plurality of build-in rules and at least one port description tag of the plurality of port description tags, the at least one procedure call defining the pro-determined function of the port associated with the at least one port description tag; and generating the testbench using the plurality of port description tags, at least one portion of the plurality of build-in rules and the at least one generated procedure call.

19. The computer-readable medium of claim 18, wherein generating the testbench comprises:
   generating a model for driving the at least one interface using the ports associated with the plurality of port description tags and the at least one portion of the plurality of build-in rules.

20. The computer-readable medium of claim 18, wherein generating the testbench comprises:
   generating a data array using the at least one procedure call, the data array comprising data to be processed by the at least one interface.

21. The computer-readable medium of claim 18, wherein generating the testbench comprises:
   generating a control array using the at least one procedure call, the control array comprising data for controlling the at least one interface.

22. The computer-readable medium of claim 18, wherein generating the testbench comprises:
   generating a data array using the at least one procedure call, the data array comprising data to be processed by the at least one interface;
   generating a control array using the at least one procedure call, the control array comprising data for controlling the at least one interface; and
   generating a model for driving the at least one interface, the model using the data of the data array and the data of the control array the at least one iInterface.

23. The computer-readable medium of claim 22, wherein generating a model comprises:
   generating the model using the ports associated with the plurality of port description tags and the at least one portion of the plurality of build-in rules.

24. A computer program product comprising:
   a procedure call generator for generating a procedure call from an entity description, the entity description defining an entity of an integrated circuit in a hardware description language, the entity of the integrated circuit comprising at least one interface having a plurality of ports each associated with a pre-determined function, the procedure call generator comprising:
      a plurality of build-in rules for constructing procedure calls;
      an accessing unit for accessing a plurality of port description tags in the entity description, each port description tag being associated with a specific part of the interface and comprising:
         at least one indication of a specific procedure call defining the pre-determined function of the associated specific port; and
         at least one parameter indicating a specific build-in rule for constructing the specific procedure call;
      a determining unit for determining, for at least one port description tag of the plurality of port description tags, the associated specific port, the at least one indication of a specific procedure call, the at least one parameter and the specific build-in rule from the plurality of build-In rules using the at least one determined parameter; and
      a generating unit for generating the specific procedure call using the at least one determined indication of the specific procedure call, the determined specific build-in rule and the determined associated specific port; and
   a signal bearing medium containing the procedure call generator.

25. The computer program product of claim 24, wherein the accessing unit is further adapted for accessing a procedure call tag in the entity description, the procedure call tag comprising an indication of at least one procedure call to be generated.

26. The computer program product of claim 24, wherein the determining unit is further adapted for determining:
   the indication of the at least one procedure call to be generated from the procedure call tag;
   the associated specific port arid the at least one parameter for each port description tag comprising an indication of a specific procedure call that matches the determined indication of the at least one procedure call to be generated; and
   the specific build-in rules from the plurality of build-in rules using the determined parameters; and
   wherein the generating unit is further adapted for generating the procedure call to be generated using the determined specific build-in rules and the determined associated specific ports.

27. A computer program product comprising:
   a testbench generator for generating a testbench for testing an entity of an integrated circuit, the entity comprising at least one interface having a plurality of ports each associated with a pre-determined function, the entity being defined by an entity description in a hardware description language, the testbench generator comprising:
      a plurality of build-in rules for constructing procedure calls;
      an accessing unit for accessing a plurality of port description tags in the entity description, each port description tag associated with a port of the interface;
      a generating unit for generating:
         at least one procedure call using at least one build-In rule of the plurality of build-In rules and at least one port description tag of the plurality of port description tags, the at least one procedure call defining the pre-determined function of the port associated with the at least one port description tag; and
         the testbench using the plurality of port description tags, at least one portion of the plurality of build-in rules and the at least one generated procedure call; and
   a signal bearing medium containing the testbench generator.

28. The computer program product of claim 27, wherein the generating unit is further adapted for generating a model for driving the at least one interface using the ports associated with the plurality of port description tags and the at least one portion of the plurality of build-in rules.

29. The computer program product of claim 27, wherein the generating unit is further adapted for generating a data array using the at least one procedure call, the data array comprising data to be processed by the at least one interface.

30. The computer program product of claim 27, wherein the generating unit is further adapted for generating a control array using the at least one procedure call, the control array comprising data for controlling the at least one interface.

31. The computer program product of claim 27, wherein the generating unit is further adapted for generating:
   a data array using the at least one procedure call, the data array comprising data to be processed by the at least one interface;
   a control array using the at least one procedure call, the control array comprising data for controlling the at least one interface; and a model for driving the at least one interface, the model using the data of the data array and the data of the control array the at least one interface.

32. The computer-readable medium of claim 31, wherein the generating unit is further adapted for generating the model using the ports associated with the plurality of port description tags and the at least one portion of the plurality of build-in rules.

33. A computer, comprising:
- a memory containing at least:
  - a procedure call generator for generating at least one procedure call from an entity description, the entity description defining an entity of an integrated circuit in a hardware description language, the entity of the integrated circuit comprising at least one interface having a plurality of ports each associated with a pre-determined function; the at least one procedure call defining the pre-determined function of at least one port of the plurality of ports, wherein the entity description contains a port description tag associated with the at least one port that indicates, to the procedure call generator, the at least one procedure call; and
- a processor adapted to execute contents of the memory.

34. A computer, comprising:
- a memory containing at least:
  - a testbench generator for generating a testbench for testing an entity of an integrated circuit, the entity comprising at least one interface having a plurality of ports each associated with a pro-determined function, the entity being defined by an entity description in a hardware description language, wherein the testbench is configured to construct procedure calls defining the predetermined functions associated with the plurality of ports using at least one build-in rule and a plurality of port description tags associated with the plurality of ports; and
- a processor adapted to execute contents of the memory.

35. A method of generating logic for an entity of an integrated circuit, the entity comprising at least one interface having a plurality of ports each associated with a pre-determined function, the entity being defined by an entity description in a hardware description language, the method comprising:
- providing a plurality of port description tags in the entity description, each port description tag associated with a port of the interface;
- providing a plurality of build-in rules for constructing logic; and
- generating logic using at least one build-in rule of the plurality of build-in rules and at least one port description tag of the plurality of port description tags, the logic defining an architecture of the entity and the pre-determined function of the port associated with the at least one port description tag.

36. A computer-readable medium containing a program which, when executed, performs an operation of generating logic for an entity of an integrated circuit, the entity comprising at least one interface having a plurality of ports each associated with a pre-determined function, the entity being defined by an entity description in a hardware description language, the operation comprising:
- accessing a plurality of port description tags in the entity description, each port description tag associated with a port of the interface;
- providing a plurality of build-in rules for constructing logic; and
- generating logic using at least one build-in rule of the plurality of build-in rules and at least one port description tag of the plurality of port description tags, the logic defining an architecture of the entity and the pre-determined function of the port associated with the at least one port description lag.

* * * * *